(12) United States Patent
Hirabayashi et al.

(10) Patent No.: US 6,295,596 B1
(45) Date of Patent: Sep. 25, 2001

(54) DATA REPRODUCING APPARATUS

(75) Inventors: Masayuki Hirabayashi; Yutaka Nagai, both of Yokohama; Toshifumi Takeuchi, Tokyo, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/156,386

(22) Filed: Sep. 18, 1998

(30) Foreign Application Priority Data

Sep. 19, 1997 (JP) .................................................. 9-254645

(51) Int. Cl.$^7$ .................................................. H03M 13/00
(52) U.S. Cl. .................................................. 711/762
(58) Field of Search .................................. 714/768–771; 386/46–47, 40; 369/47

(56) References Cited

U.S. PATENT DOCUMENTS

| | | | |
|---|---|---|---|
| 4,698,810 | * 10/1987 | Fukuda et al. | 714/758 |
| 5,461,630 | * 10/1995 | Endo et al. | 714/71 |
| 5,548,599 | * 8/1996 | Furuhashi et al. | 714/769 |
| 5,841,938 | * 11/1998 | Nitta et al. | 386/68 |
| 6,061,494 | * 5/2000 | Kikuchi | 386/47 |
| 6,130,988 | * 10/2000 | Jeong | 386/125 |

OTHER PUBLICATIONS

"Synchronous Dram Application Note", Hitachi, Ltd., Sept. 1996.

* cited by examiner

Primary Examiner—Albert Decady
Assistant Examiner—Shelly A Chase
(74) Attorney, Agent, or Firm—Antonelli, Terry, Stout & Kraus, LLP

(57) ABSTRACT

Arrangement to temporarily store matrix-formed data with error correction codes in row and column directions in memory, and read out the data fast in both row and column directions to perform error correction. When error correction is performed in the error correction circuit 6, data inputted from the data input circuit 7 is placed on the memory 11 so that the data is read out from a plurality of banks on the memory 11 while the banks are switched.

17 Claims, 11 Drawing Sheets

SDRAM operation transfer timing chart by bank switching

Read : Read
P : Precharge

FIG.12

DATA REPRODUCING APPARATUS

TECHNICAL FIELD OF THE INVENTION

The present invention relates to a data reproducing apparatus including a memory control circuit for performing data transfer between memory and an input-output circuit, and further relates to an arrangement for performing error correction of matrix-formed data at improved speeds by using a memory-bank or memory switching.

BACKGROUND DISCUSSION

Memory is primarily classified into two types in terms of its function; ROM (Read Only Memory) and RAM (Random Access Memory). Moreover, RAM has two subcategories: SRAM (Static RAM) and DRAM (Dynamic RAM). DRAM generally has a lower access speed and more complicated control circuits than SRAM but is cheaper and has a higher capacity than SRAM, and accordingly, it is widely used primarily in personal computers and other consumer-electronics products. For example, DRAM is used as data error correction memory and buffer memory in reproducing apparatuses using the CD (Compact Disc) and DVD (Digital Video Disc) formats.

As described previously, since DRAM has the disadvantage that it is generally slower than SRAM in access time and cycle time, its access speed is improved using a fast access mode called page mode, i.e., for increasing an effective access time. DRAM is read out in the following order. A word line is selected from a row address and all data of memory cells connected to the word line is sent to a sense amplifier. Next, some of sense amplifiers are selected by a column address and the data is sent to an output buffer. Accordingly, after the output of the sense amplifiers has been determined, data of another memory cell can be accessed by simply changing the column address. In the page mode, in which access is made by changing a column address, data is only sent from a sense amplifier to an output pin, so that access time is reduced in comparison with normal cycles.

Figure 11:
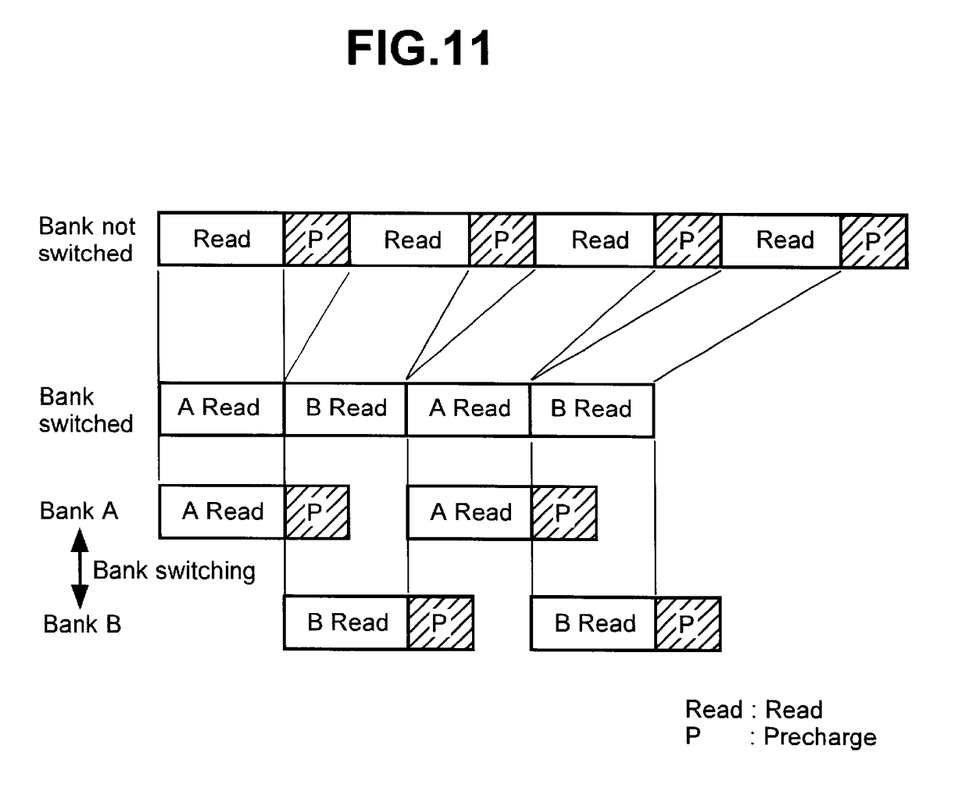
FIG. 11 is a diagram comparing non-bank-switching to bank-switching.

A sort of DRAM provided with additional functions to speed up access time and cycle time is SDRAM (Synchronous DRAM). More particularly, SDRAM is a DRAM which configures an interface with a synchronous circuit so that data can be continuously inputted and outputted synchronously with an external clock to provide high-speed data transfer. Operation control is carried out by commands consisting of a combination of RAS (Row Address Strobe), CAS (Column Address Strobe), and WE (Write Enable), and further, command input and data input-output all synchronize with the external clock. The burst mode allows data to be continuously inputted and outputted synchronously with the clock. Moreover, the memory is split into two or four banks (areas), each of which can be controlled independently. Since normal DRAM is configured with one bank, a change of a row address always requires a precharge time, and for the duration of such precharge, data output must be stopped. Since SDRAM has a plurality of banks, if two banks, e.g., are alternately accessed, precharge time can be effectively hidden which has been so far required during switching of row addresses. More particularly, FIG. 11 shows an example of bank switching, and more specifically, shows a comparison of non-bank-switching (upper portion of FIG. 11) and bank switching (lower portion of FIG. 11). Precharge time (crosshatched areas designated with a "P") exists whether banks are switched or not, but when banks are switched, precharge time is hidden by alternately accessing two banks.

Turning now to discussion of problems in the art, DRAM has the disadvantage that it is generally slower than SRAM in access time and cycle time, and the fast access mode described previously is provided to improve access speed. However, the fast access mode described previously requires a condition of identical row addresses.

Figure 12:
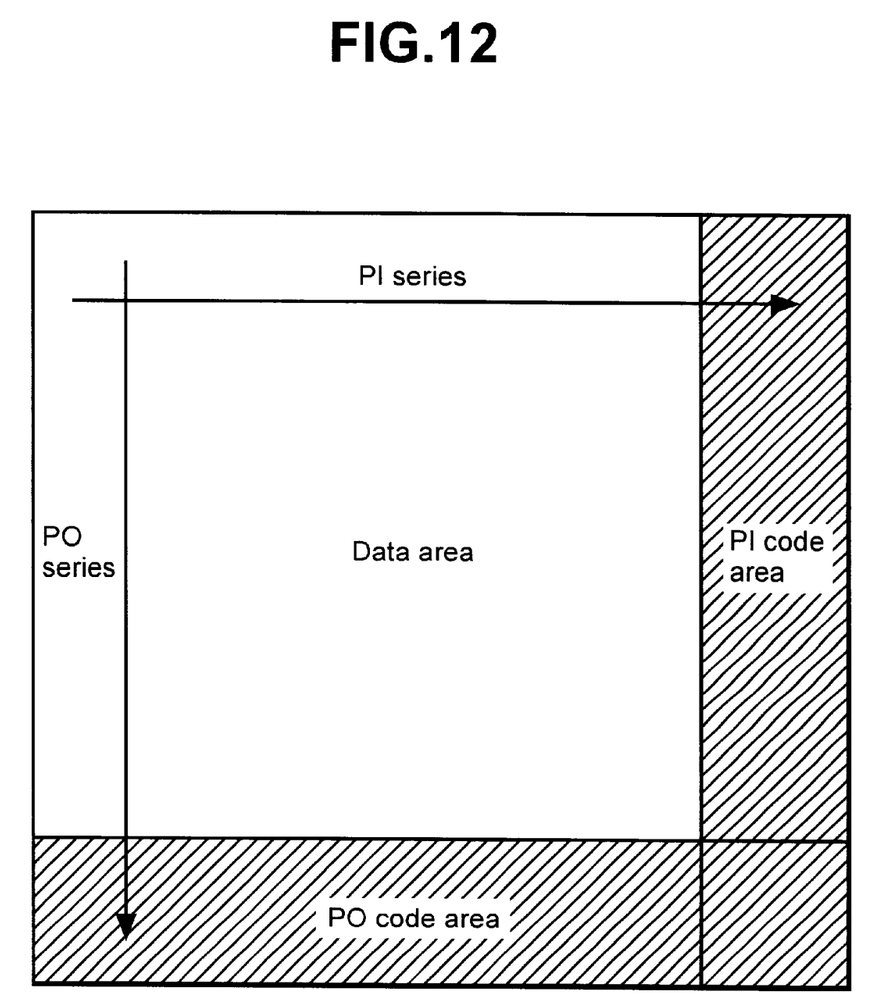
FIG. 12 is a diagram showing a configuration of DVD data and error correction codes.

The following describes an example of DRAM used as an error correction memory of a DVD reproducing apparatus. More particularly, FIG. 12 shows a DVD error correction block. Error correction codes employed in DVD are CIRC (Cross Interleave Reed-Solomon Code) which is also used in CD and DAT, etc., and which provides a high correction capability by using both inner code parity PI (Parity Inner) and outer code parity PO (Parity Outer). The data is separated on a byte basis and is provided with an identification address to form a sector, and a matrix is formed by a collection of 16 sectors. The second error correction code (PO code) is appended to the data in a column direction and a first error correction code (PI code) is appended to both the data in a row direction and also to the PO code. One sector has 2K bytes of data, while one correction block which occupies 16 sectors is comprised of 32K bytes of data and error correction codes PI and PO. To correct errors, the data and error correction codes must be temporarily stored in memory before being read out for each of the PI and PO series.

In this case, if the data is written to DRAM so that the data in the PI series, for example, has identical row addresses, the data in the PI series can be read out fast by simply changing column addresses after first specifying a row address. However, the data in the PO series cannot be read out fast because all pieces of the data have different row addresses, i.e., precharge is required for any row address change. On the other hand, if the data is written to DRAM so that the data in the PO series has identical row addresses, although the data in the PO series can be read out fast, the data in the PI series cannot be read out fast.

As described above, there is the problem that, when errors are corrected using DRAM, data in the PI and PO series cannot be read out at equal speeds, i.e., one of the PI and PO series reads out faster, so that the overall transfer speed cannot be remarkably improved.

As further background, attention is directed to Parris et al. (U.S. Pat. No. 5,671,392).

SUMMARY OF THE INVENTION

An object of the present invention is to provide a data reproducing apparatus capable of reading out data in the PI and PO series of a DRAM at equal speeds, i.e., at mutually fast speeds.

To solve the above mentioned problem, a data reproducing apparatus according to the present invention employs the technical means described below. More particularly, when the data in at least one of the PI and PO series is subjected to error correction by an error correction means, the data is placed in memory so that it is read out from a plurality of banks while the banks are switched in a predetermined unit.

Further, when the data in at least one of the PI and PO series is subjected to error correction by an error correction means, the data is placed in separate plural memories so that it is read out from such plurality of memories while the memories are switched in a predetermined unit.

Further, when the data in at least one of the PI and PO series is subjected to error correction by an error correction means, address control is performed so that the highest address of address lines of memory is switched each time a predetermined number of pieces of the data (i.e., predetermined burst data) in the PO or PI series is written or read out.

Still further, when data is written to memory, address control is performed so that the highest address of an address signal of memory is changed at the same cycle as a burst setting number of the memory.

More particularly, the present invention relates to a data reproducing apparatus comprising: a reading arrangement which reads out data from recording media; a signal processor which for demodulates the data from the reading arrangement; a plurality of memory areas to or from which the data demodulated via the signal processor is written or read; and an error corrector which corrects errors of the demodulated data, wherein the demodulated data is placed in the plurality of memory areas so that the demodulated data is read out from the plurality of memory areas while the plurality of memory areas is cyclically switched in a predetermined unit, during error correction by the error corrector.

The foregoing and a better understanding of the present invention will become apparent from the following detailed description of exemplary embodiments and the claims when read in connection with the accompanying drawings, all forming a part of the disclosure hereof this invention. While the foregoing and following written and illustrated disclosure focuses on disclosing exemplary embodiments of the invention, it should be clearly understood that the same is by way of illustration and example only and is not to be taken by way of limitation, the spirit and scope of the present invention being limited only by the terms of the appended claims.

BRIEF DESCRIPTION OF THE DRAWINGS

The following represents brief descriptions of the drawings, wherein.

DETAILED DESCRIPTION OF THE INVENTION

Before beginning a detailed description of the subject invention, mention of the following is in order. When appropriate, like reference numerals and characters are used to designate identical, corresponding or similar components in differing figure drawings. Further, in the detailed description to follow, exemplary sizes/models/values/ranges are given in parenthesis, although the present invention is not limited to the same. Still further, the clock and timing signal FIGS. are not drawn to scale, and instead, exemplary and critical time values are mentioned when appropriate. Finally, power connections and/or clock connections to ICs and other components within the Figs. are not shown for simplicity of illustration and discussion.

Figure 2:
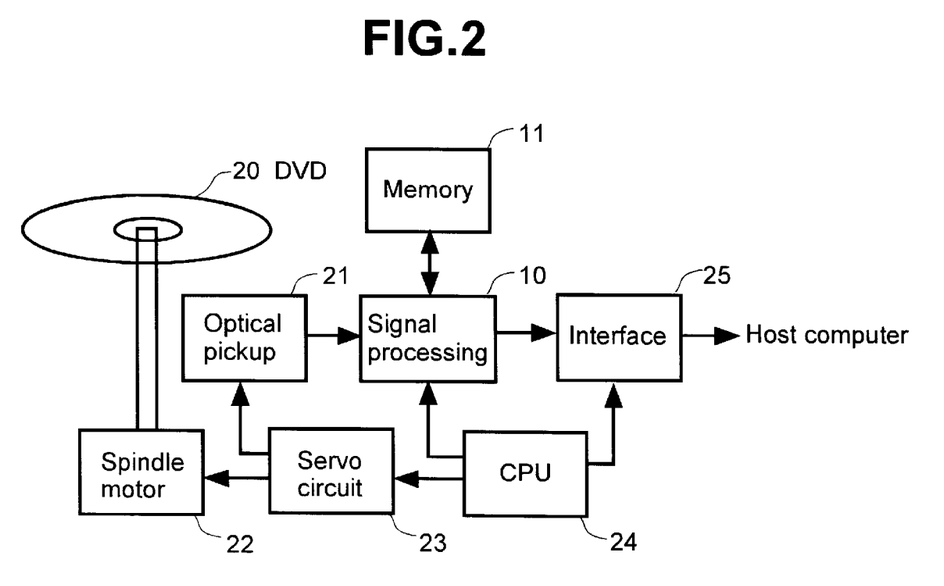
FIG. 2 is a block diagram showing a configuration of a signal processing circuit of the first embodiment.

Turning now to detailed description, a data reproducing apparatus of the present invention, as applied to a DVD reproducing apparatus, will be discussed hereinafter in terms of the preferred embodiments with reference to the drawings. More particularly, FIG. 2 is a block diagram showing a data reproducing apparatus according to a first embodiment of the present invention. FIG. 2 shows a DVD reproducing apparatus which comprises an optical pickup 21, spindle motor 22, servo circuit 23, CPU 24, interface 25, signal processing circuit 10, and memory 11.

The DVD disc 20 is rotated by the spindle motor 22 and data is read out from such disc by the optical pickup 21. The read data is demodulated by the signal processing circuit 10 and is written to the memory 11. The written data is read again from the memory 11 by the signal processing circuit 10 and is subjected to error correction. The data having been subjected to error correction is sent to a host computer (not shown) via the interface 25 by the signal processing circuit 10. The CPU 24 controls the signal processing circuit 10 and the interface 25, and also controls the optical pickup 21 and spindle motor 22 via the servo circuit 23.

Figure 1:
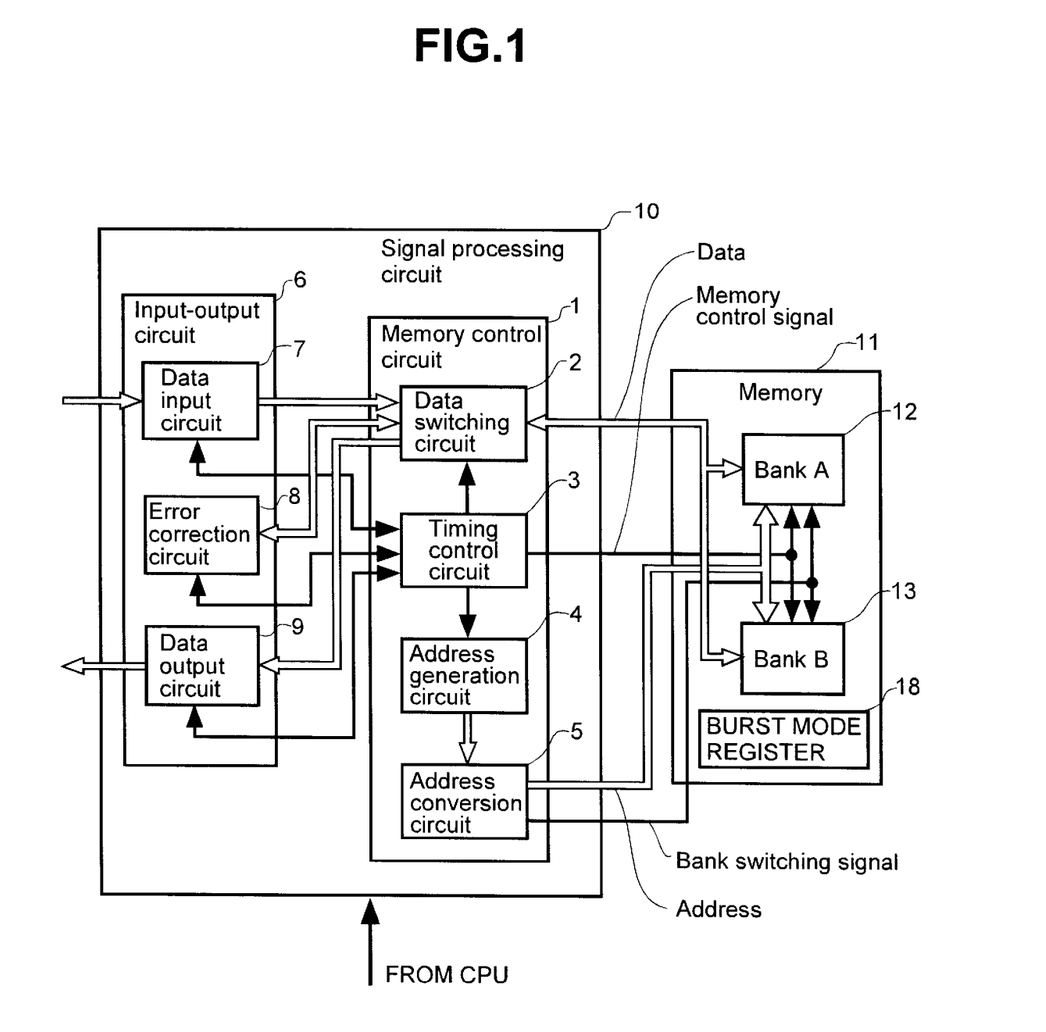
FIG. 1 is a block diagram showing the configuration of a data reproducing apparatus according to a first embodiment.

FIG. 1 is a detailed block diagram of the signal processing circuit 10 of the DVD reproducing apparatus in FIG. 2. In FIG. 1, a memory control circuit 1, which comprises a data switching circuit 2, timing control circuit 3, address generation circuit 4, and address conversion circuit 5, performs data transfer between an input-output circuit 6 and the memory 11. The data switching circuit 2 transfers data sent from the input-output circuit 6 to the memory 11. It also transfers data from the memory 11 to the input-output circuit 6. The timing control circuit 3 controls the data switching circuit 2 and the address generation circuit 4, controls data transfer to and from the input-output circuit 6, and generates memory control signals to control the memory 11. The address generation circuit 4 generates a first address signal. The address conversion circuit 5 converts the first address signal into a second address signal and outputs it to the memory 11. It further generates a bank switching signal to output to the memory 11.

The input-output circuit 6 comprises a data input circuit 7, an error correction circuit 8, and a data output circuit 9. The data input circuit 7 demodulates data inputted from the outside and writes it to the memory 11 via the memory control circuit 1. The error correction circuit 8 receives read out data from the memory 11 via the memory control circuit 1, performs error correction, and outputs the corrected data to be written to the memory 11 via the memory control circuit 1. The data output circuit 9 receives the corrected data from the memory 11 via the memory control circuit 1 and outputs such corrected data to the outside.

The memory 11 (SDRAM) has two banks A and B, and data is written to or read from such memory 11 according to memory control signals outputted from the memory control circuit 1. The reference numerals 12 and 13 designate banks A and B, respectively, to and from which data can be written and read out, independently of each other. Banks in the PI or PO series can be switched in any unit depending on the system, without being limited to FIG. 6.

The data demodulated in the data input circuit 7, separated on a byte basis, is provided with an identification address to form a sector, while a matrix is formed by a collection of 16 sectors, such matrix having a PO code appended to the data in a column direction and a PI code appended to both the data in a row direction and the PO code.

After the data and codes are temporarily stored in the memory from the input circuit, they are read out from the memory for each of the PI series in a row direction and the PO series in a column direction, are subjected to error correction, and are written to the memory again. The data having been subjected to error correction is output to the outside from the data output circuit 9.

Figure 3:
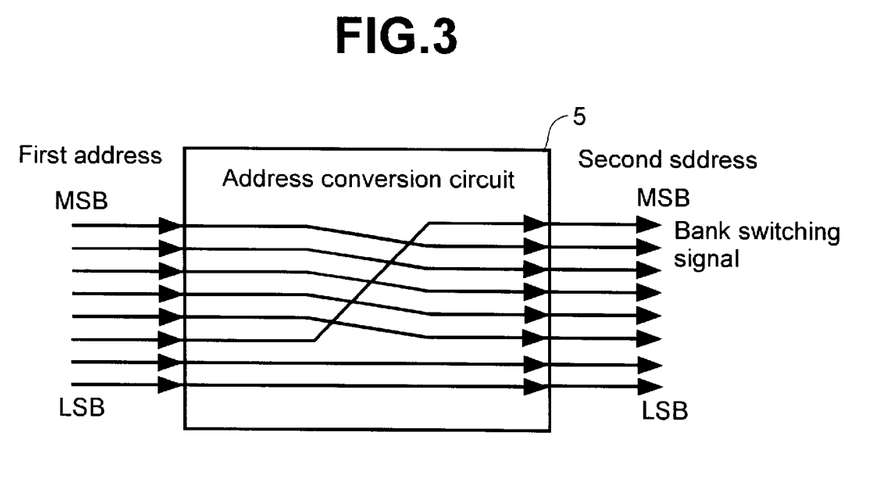
FIG. 3 is a diagram showing an effective conversion performed by an address conversion circuit of the first embodiment.

FIG. 3 shows a block diagram of the address conversion circuit 5. In an SDRAM application, the most significant bit (MSB) of an address is a bank switching signal. (For further understanding of SDRAMs, attention is directed to "Synchronous DRAM Application Note" of Hitachi, Ltd.) For example, if the data path of an SDRAM is 16 bits in length and banks are switched in units of 8 bytes, in order easily to convert a normal series of continuous addresses to a cyclic series of addresses where the MSB holds a logical 0 for four clocks and then holds logical 1 for four clocks resulting (for a burst length of 4 and a cyclic 8 series) the FIG. 3 address conversion arrangement is used. More particularly, the third lowest bit, which holds a logical 0 for four clocks and then a logical 1 for four clocks and repeats such pattern every 8 clocks, is shifted to be used as the MSB, while the five highest significant bits are each shifted down one bit. The two lowest significant bits remain unshifted. (Other arrangements are available, e.g., shifting of the fourth lowest bit can be made for a burst length of 8). Accordingly, if a continuous address is inputted as a first address to the address conversion circuit 5, a second address as a bank switching signal for switching banks every 8 bytes is outputted.

In an SDRAM, the length of data that can be continuously inputted or outputted by one command is defined as burst length and the number of clocks from a read command set to data output is defined as CAS latency (corresponding to normal DRAM access time). FIG. 1 illustrates a burst mode register 18 contained within the memory 11, which register can be selectably programmed with a desired burst length value. In the FIG. 1 embodiment, the memory control circuit 1 is also aware of the burst length value for proper timing and address control. The burst length value can be set to differing values for a PI series access and a PO series access, or can be set to equal values for both accesses, as will become apparent from the discussions ahead.

Figure 4:
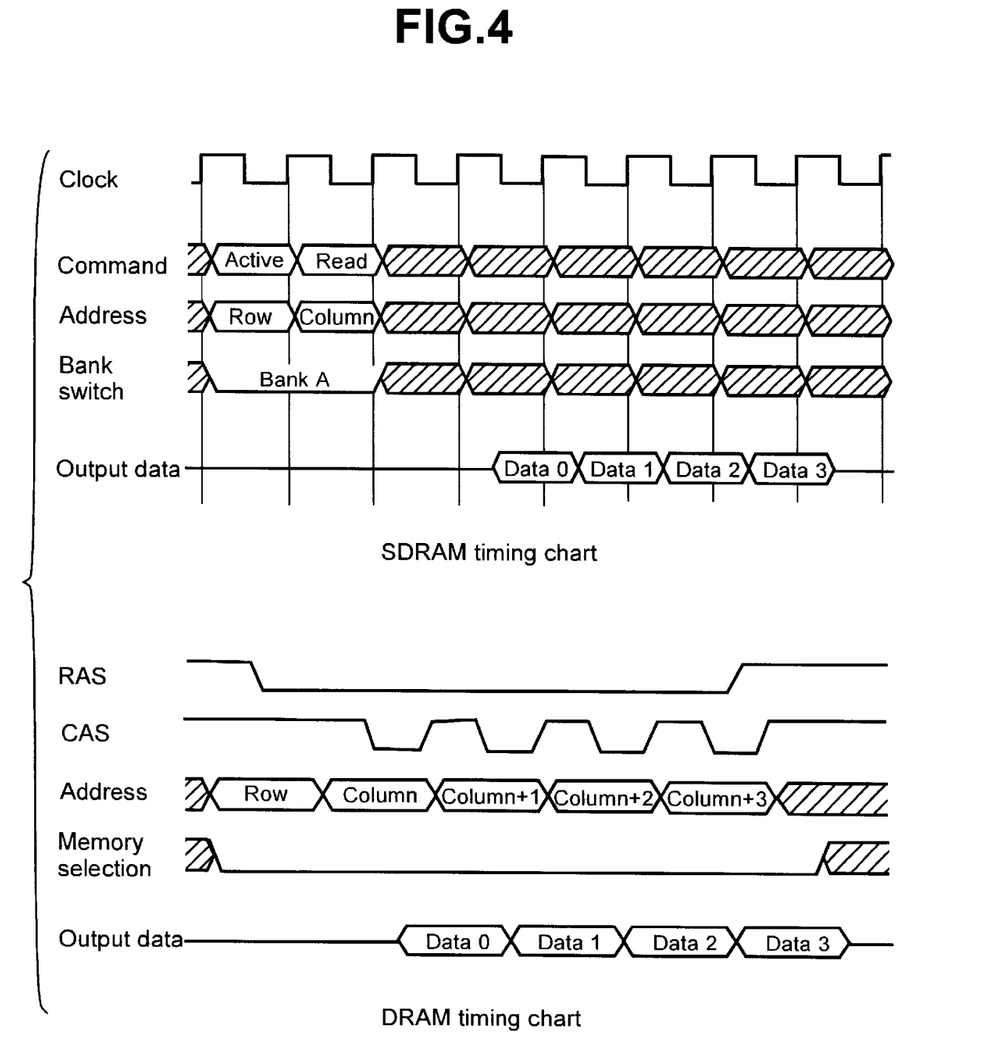
FIG. 4 is a diagram showing the timing charts of an SDRAM and DRAM.

FIG. 4 shows the timing charts for comparison of an access operation of a DRAM and SDRAM. In the case of SDRAM (upper portion of FIG. 4), when the first address is specified, data of a predetermined burst length can be written or read out by internally incrementing the address. The figure shows an example of a 33-MHz clock, burst length 4, and CAS latency 2 in the conditions of which one read command is executed on 7 clocks, followed by one clock of precharge. If the data path is 16 bits in length, 8 bytes of data can be read out by one read command. To perform a similar transfer using the page mode in DRAM, addresses successively incremented must be inputted from the outside.

Figure 5:
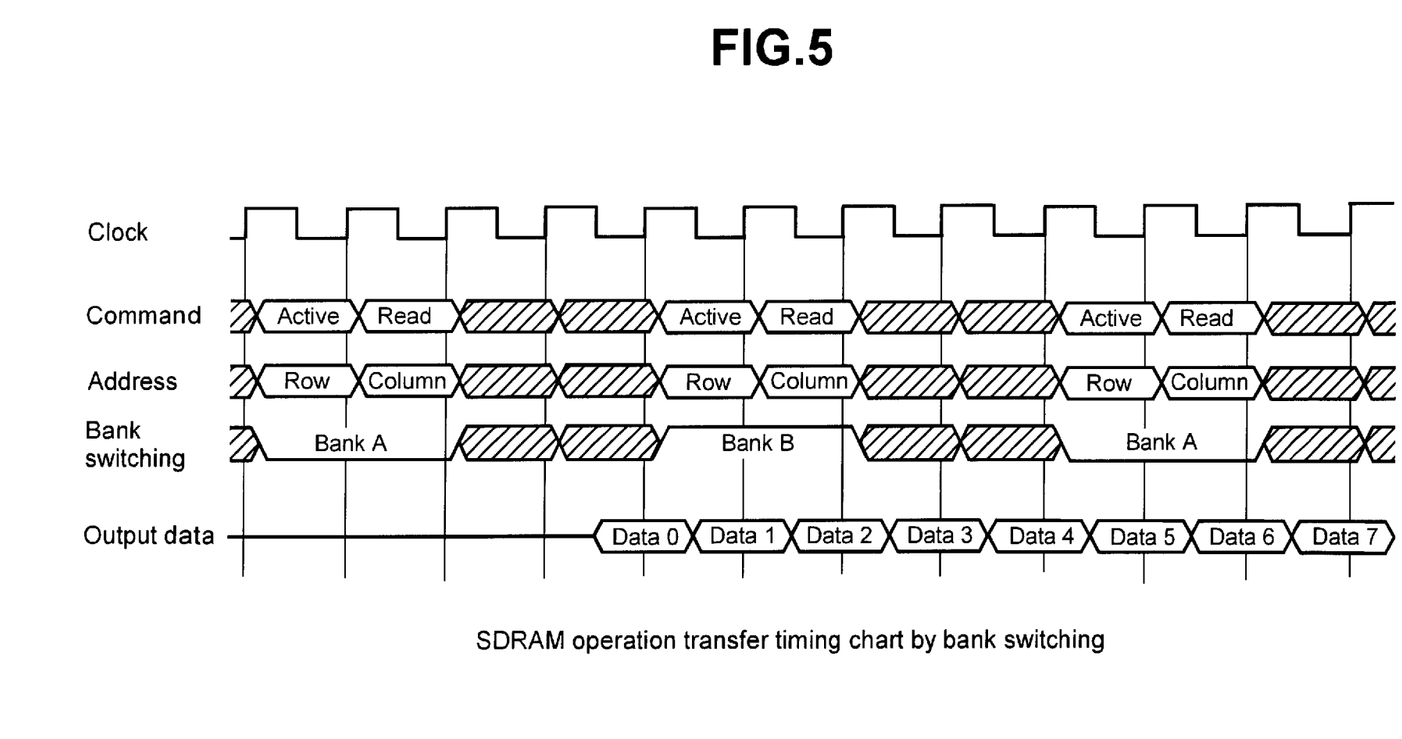
FIG. 5 is a diagram showing the timing chart of an SDRAM of the first embodiment.

FIG. 5 shows an example of continuously reading out data by switching between banks A and B for each data transfer with a burst length of 4 in an SDRAM. With SDRAM, the data can be thus read out from different banks without break by repeatedly issuing a read command. Still, a transfer rate is not reduced due to precharge or access time during reading of continuous data, because the precharge of one bank is effectively hidden by switching to utilize the other bank during precharge. When the data in the PI and PO series is thus read by repeating a read command, the number of clocks required is reduced from 7 clocks multiplied by the number of repetitions (the conventional number of clocks required) to 7 clocks plus 4 clocks multiplied by (the number of repetitions−1). That is, reduction in a data transfer rate due to precharge and CAS latency can be avoided to read out data fast.

From a different viewpoint, data can be continuously read out by changing addresses at the same cycle as a burst setting number.

Figure 6:
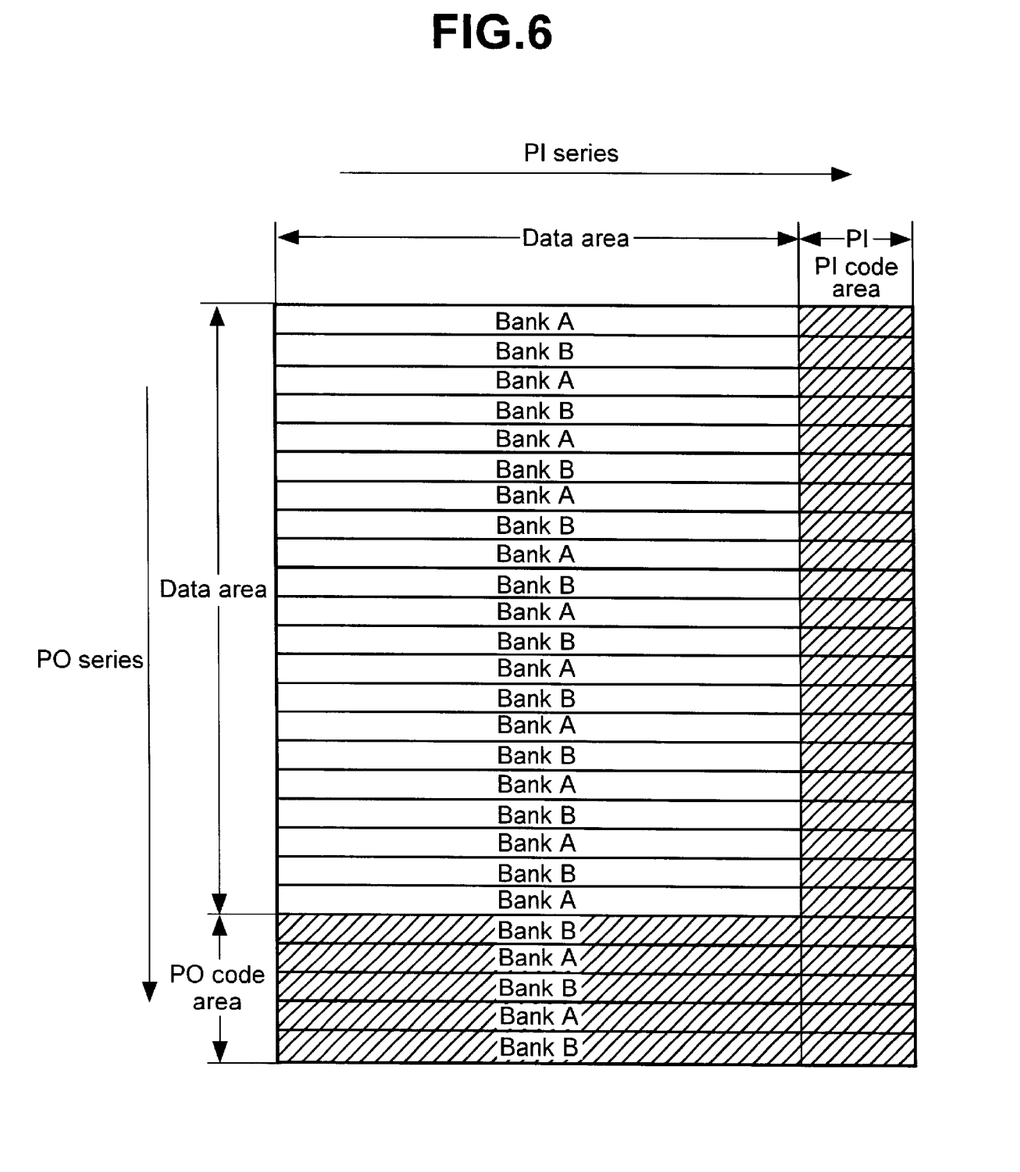
FIG. 6 is a diagram showing a memory layout of the first embodiment.

FIG. 6 shows the relationship between DVD data, PI and PO error correction code areas, and banks A and B. As described previously, to perform error correction, data must be temporarily stored in memory from the input circuit. In this case, the data is placed in the memory in the order of the PI series while banks are switched for each row of the PI series. As a result, since the continuous addresses of identical banks appear in the PI series, in the case of SDRAM, the data can be read out fast by setting a long burst length during error correction on the data in the PI series. In the PO series, although discontinuous addresses appear, since an identical bank does not appear (i.e., is not accessed) continuously, the data can be read out fast by switching the banks during error correction.

In other words, the data is placed as shown in FIG. 6 so that the data is read out from a plurality of banks using bank switching (in the embodiment, banks A and B are alternated or sequentially placed) in a predetermined data unit (8 bytes in the embodiment). From a different viewpoint, provided that the bank switching signal in FIG. 3 and the second address are used as a memory address viewed from the memory, the most significant bit of the memory address is switched for each row of the PI series, so that the data can be read out fast by bank switching during error correction for the PO series.

A DRAM allows data to be read out fast using the page mode or the like during error correction for the PI series. Moreover, although discontinuous addresses appear in the PO series, since an identical bank does not appear continuously, the data can be read out fast by switching the banks during error correction. FIG. 6 shows an example of bank switching for each row of the PI series. Bank switching for each row of the PO series also allows the data to be read out fast as in the above case.

According to the first embodiment of this invention as described in the above mentioned configuration, by reading data while switching banks for each row of the PI or PO series, the data can be read out fast with a long burst length (i.e., a burst length value of 182 as set in the register 18) in one series (e.g., the FIG. 6 PI series), while the data can be read out fast by bank switching (i.e., a burst length value of 4 as set in the register 18) in another series (e.g., the FIG. 6 PO series).

Figure 7:
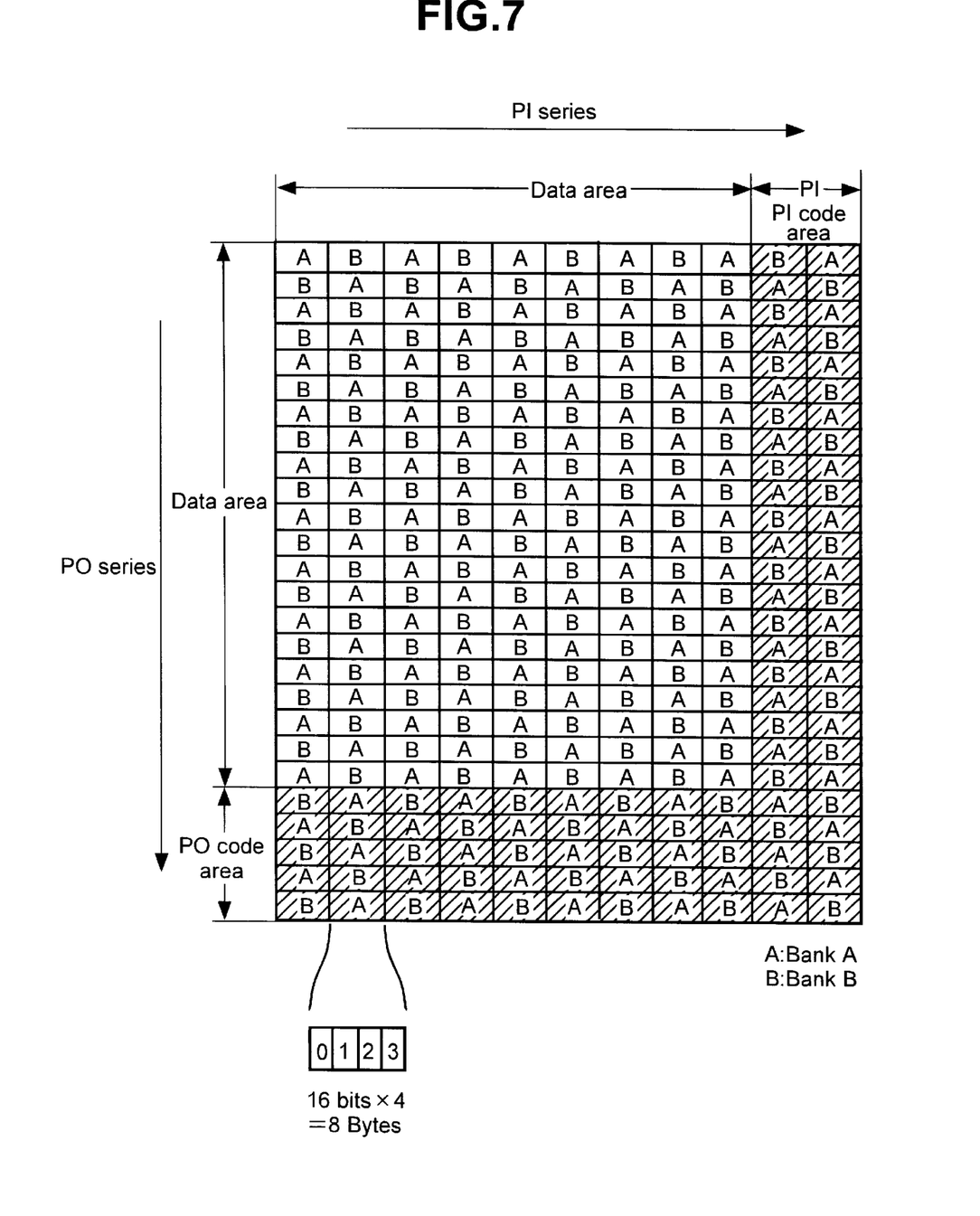
FIG. 7 is a diagram showing a memory layout of a second embodiment.

FIG. 7 shows the relationship between DVD data, PI and PO error correction code areas, and banks A and B according to a data reproducing apparatus of a second embodiment of this invention. When data is temporarily stored in memory from the input circuit, the data is placed on the memory while banks are switched in a predetermined unit so that an identical bank does not appear continuously in either of the PI and PO series, as shown in the figure. In FIG. 7, the banks are switched for each transfer of 8 bytes with a burst length of 4. More particularly, in contrast to the FIG. 6 embodiment, the burst length value (of 4) set in the register 18 is not changed when reading out in the PI or PO series. In this way, since identical banks do not appear (i.e., are not accessed) continuously in each of the PI and PO series, the data can be read out fast while the banks are switched during error correction.

In FIG. 7, when data of the PO series is read, for example, if error correction processing is performed in units of 16 bits and the error correction circuit processes only one piece of data of the PO series, data other than the first 16-bit data of each transfer data is meaningless. By providing an error correction circuit which processes four pieces of data of the PO series in parallel, all 8 bytes (16 bits×4) of data can be obtained and be subjected to error correction. That is, to effectively use the memory, the number of bytes of data to be transferred must be made the same as the number of bytes that can be subjected to error correction at the same time.

According to the second embodiment of this invention as described in the above mentioned configuration, by writing data while switching banks in a predetermined unit, the data can be read out fast by switching the banks in each of the PI and PO series. From a different viewpoint, as in the case of the first embodiment, data can be read out continuously by changing addresses at the same cycle as a burst setting number in the PI and PO series. From a further different viewpoint, as in the case of the first embodiment, provided that the bank switching signal in FIG. 3 and the second address are used as a memory address viewed from the memory, the most significant bit of the memory address is switched for each four rows of the PO series, whereby banks of the PI series are switched, and further, the most significant bit of the memory address is switched for each row of the PI series, whereby banks of the PO series are switched, so that data can be read out fast. The unit of bank switching in the PI or PO series and the number of banks can be set to any value depending on the system, without being limited to FIG. 7.

According to the first embodiment, data in one series is read out fast with a long burst length or using the page mode, while data in another series is read out fast by switching the banks. To achieve this, data in one series must have an identical row address because of the DRAM properties, and there is the problem that an unused portion may occur at an identical row address of memory depending on an error correction block, resulting in reduced use efficiency. On the other hand, a characteristic of the second embodiment is that memory use efficiency is not reduced because data is read out by switching the banks in both series.

In the first embodiment, a long burst length, say, 256 must be specified in the PI series, and in the PO series, the use of bank switching and a short burst length, say, 4 must be declared (extra data may be read if a long burst length is left intact), so that it takes a considerable amount of time to switch between the modes. On the other hand, in the second embodiment, since switching between the modes is unnecessary, a fast transfer is achieved in view of the whole system.

Figure 8:
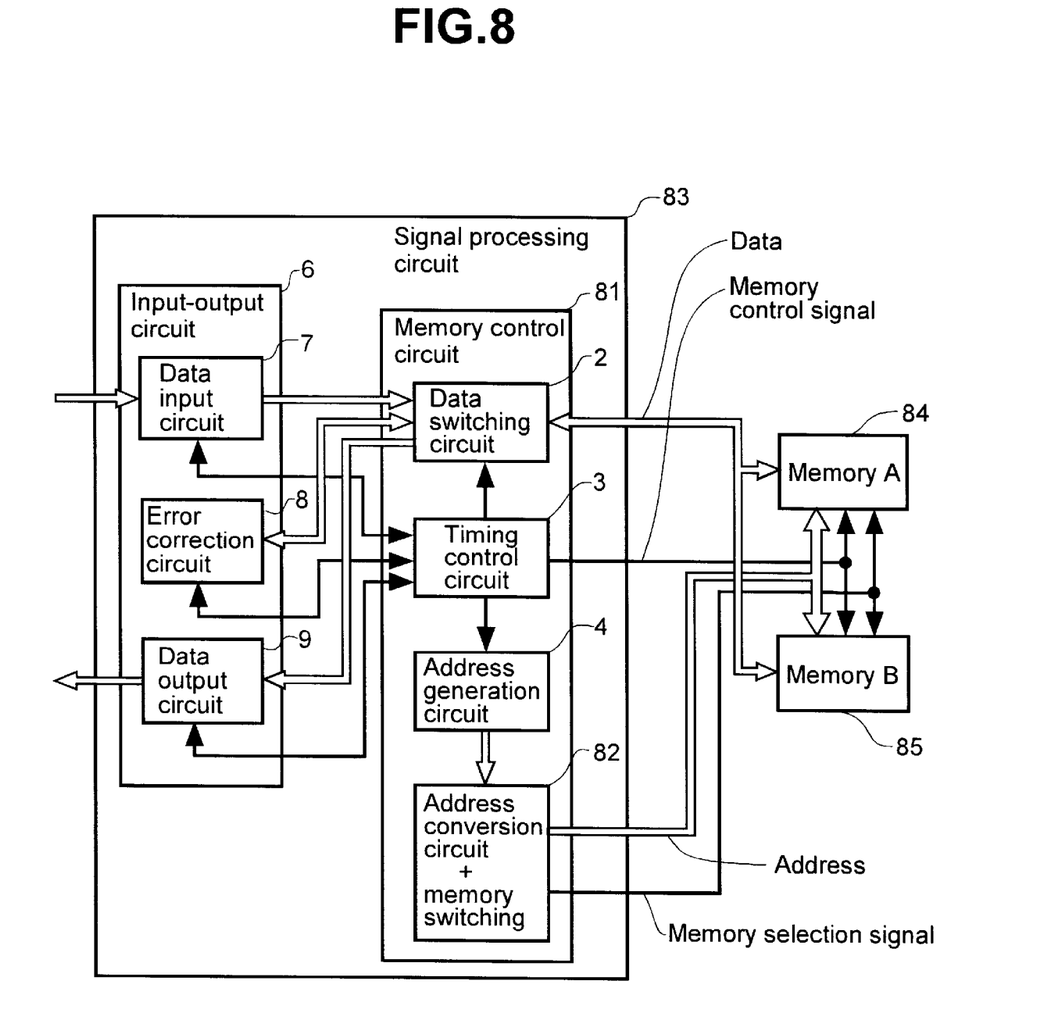
FIG. 8 is a block diagram showing the configuration of a data reproducing apparatus according to a third embodiment.

FIG. 8 is a block diagram showing a data reproducing apparatus according to a third embodiment of this invention. In the first and second embodiments, data is read out fast from memory having a plurality of banks. On the other hand, the use of a plurality of separately provided memories each not having a plurality of banks allows the data to be read out fast as in the case of the first and second embodiments.

In FIG. 8, the reference numeral 81 designates a memory control circuit, which comprises a data switching circuit 2, timing control circuit 3, address generation circuit 4, and memory switching circuit 82, performs data transfer between an input-output circuit 6 and memories 84 and 85. The data switching circuit 2 transfers data sent from the input-output circuit 6 to the memories 84, 85. It also transfers data from the memories 84, 85 to the input-output circuit 6. The timing control circuit 3 controls the data switching circuit 2 and the address generation circuit 4, controls data transfer to and from the input-output circuit 6, and generates memory control signals to control the memories 84, 85. The address generation circuit 4 generates an address signal for accessing the memories 84, 85. The memory switching circuit 82 converts/outputs addresses and switches between the memories 84 and 85 in response to an address.

The reference numeral 6 designates an input-output circuit, which comprises a data input circuit 7, error correction circuit 8, and data output circuit 9. The data input circuit 7 writes data inputted from the outside to the memories 84 and 85 via the memory control circuit 81. The error correction circuit 8 receives read out data from the memories 84 and 85 via the memory control circuit 81, performs error correction, and outputs the corrected data to be written to the memories 84 and 85 via the memory control circuit 81. The data output circuit 9 receives the corrected data from the memory 11 via the memory control circuit 81 and outputs such corrected data to the outside.

The reference numerals 84 and 85 designate memories A and B (DRAM), respectively, to and from which data is written and read out according to memory control signals outputted from the memory control circuit 81. Just like the FIG. 1 memory control circuit 1, the FIG. 8 memory control circuit 81 is aware of a desired burst length value (e.g. by containing an internal burst length register) for proper timing and address control of the memories 84, 85, when performing accessing along either of the PI or PO series. Further, as one generic embodiment, the memory control circuit may be adaptable or programmable to facilitate any burst length value.

Figure 9:
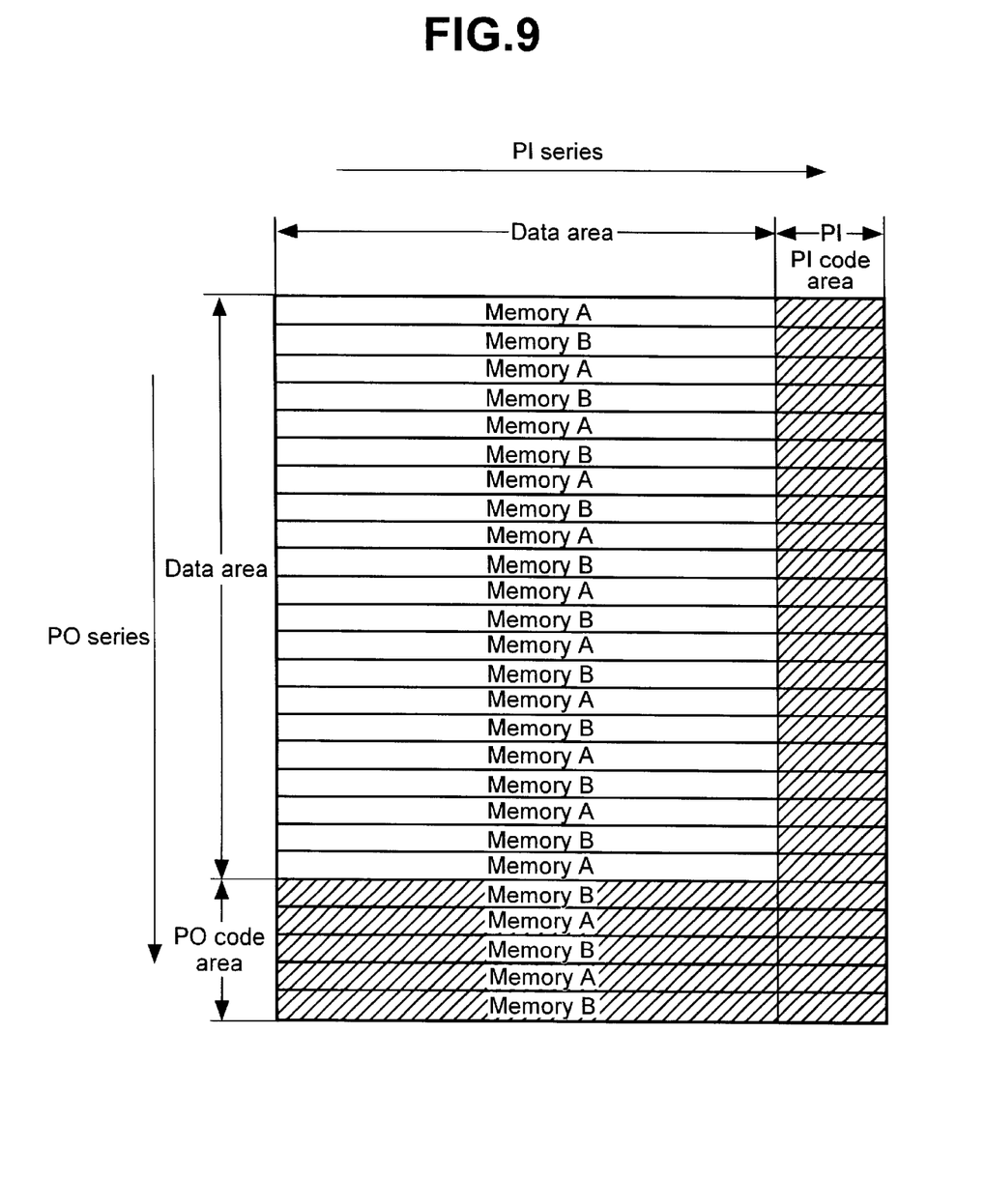
FIG. 9 is a diagram showing a memory layout of the third embodiment.

FIG. 9 shows the relationship between DVD data, PI and PO error correction code areas, and memories A and B. As described previously, to perform error correction, data must be temporarily stored in the memories from the input circuit. In this case, the data is placed in the memories in the order of the PI series while the memories are switched for each row of the PI series. As a result, since the continuous addresses of identical memories appear in the PI series, the data can be read out fast using the page mode or the like during error correction on the data in the PI series. In the PO series, although discontinuous addresses appear, since identical memories do not appear (i.e., are not accessed) continuously, the data can be read out fast while the memories are switched during error correction.

FIG. 9 shows an example of memory switching for each row of the PI series. Memory switching for each row of the PO series also allows the data to be read out fast as in the above case.

According to the third embodiment of this invention as described in the above-mentioned configuration, by writing data while switching memories for each row of the PI or PO series, the data can be read out fast using the page mode or the like in one series, while the data can be read out fast by memory switching in another series.

Figure 10:
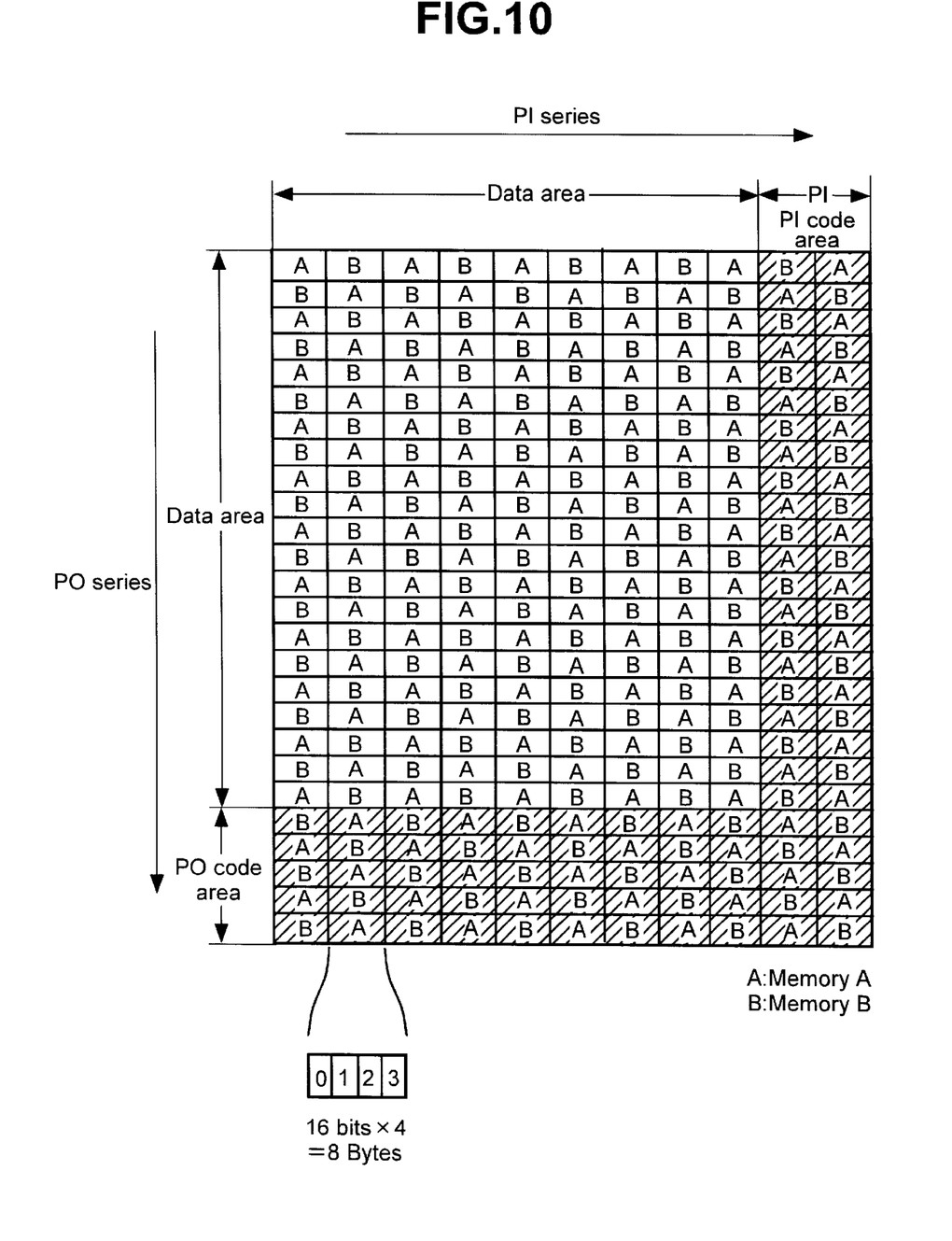
FIG. 10 is a diagram showing a memory layout of a fourth embodiment.

FIG. 10 shows the relationship between DVD data, PI and PO error correction code areas, and memories A and B according to a data reproducing apparatus of a fourth embodiment of this invention. When the data is temporarily stored in memory from the input circuit, the data is placed in the memories while the memories are switched in a predetermined unit so that an identical memory does not appear (i.e., is not accessed) continuously in each of the PI and PO series, as shown in the figure. In this way, since an identical memory does not appear (i.e., is not accessed) continuously in each of the PI and PO series, the data can be read out fast by switching the memories during error correction. The unit of memory switching in the PI or PO series and the number of memories can be set to any value depending on the system, without being limited to FIG. 10.

According to the fourth embodiment of this invention as described in the above mentioned configuration, by writing data while switching memories in a predetermined unit, the data can be read out fast while the memories are switched in each of the PI and PO series. According to the third embodiment, data is read out fast using the page mode in one series, while the data is read out fast by switching the memories in another series. To achieve this, the data in one series must have an identical row address because of the DRAM properties, and there is the problem that an unused portion may occur at an identical row address of memory depending on an error correction block, resulting in reduced use efficiency. A characteristic of the fourth embodiment is that memory use efficiency is not reduced because data is read out by switching the memories in both series.

Although the above mentioned embodiments are described on the assumption that this invention is applied to a DVD reproducing apparatus and DRAM or SDRAM is used as memory, this invention is not limited to such exemplary embodiments, but can be embodied with variations without departing from objects thereof.

In final summary, this invention, with the above mentioned configuration, permits fast readout of data in each of the PI and PO series during error correction.

This concludes the description of the preferred embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A data reproducing apparatus comprising: a reading arrangement which reads out data from recording media; a signal processor which demodulates the data from said reading arrangement; a plurality of memory areas to or from which the data demodulated via said signal processor is written or read; and an error corrector which corrects errors of said demodulated data, wherein said demodulated data is placed in said plurality of memory areas so that said demodulated data is read out from said plurality of memory areas while said plurality of memory areas is cyclically switched in a predetermined unit, during error correction by said error corrector;

wherein said demodulated data in said plurality of memory areas are stored in a two-dimensional row/column matrix type of arrangement having error correction data with respect to both rows and columns, and wherein the correcting errors operation is performed with respect to both rows and columns; and wherein said demodulated data in the rows are divided according to a first predetermined data unit, and said demodulated data in the columns are divided according to a second predetermined data unit, and wherein said plurality of memory areas are switched in a first predetermined burst length when said memory is accessed in a row direction, and wherein said plurality of memory areas are switched in a second predetermined burst length when said memory is accessed in a column direction.

2. A data reproducing apparatus as claimed in claim 1, wherein said demodulated data in said plurality of memory areas are stored in a multi-dimensional matrix type of arrangement having error correction data with respect to each dimension, and wherein the correcting errors operation is performed on data along all dimensions.

3. A data reproducing apparatus as claimed in claim 1, wherein said first predetermined data unit and said second predetermined data unit are equal, and wherein said first predetermined burst length and said second predetermined burst length are equal.

4. A data reproducing apparatus as claimed in claim 1, wherein said first predetermined data unit and said second predetermined data unit are different, and wherein said first predetermined burst length and said second predetermined burst length are different.

5. A data reproducing apparatus as claimed in claim 1, further comprising a memory controller generating an address and a memory area selecting signal such that said demodulated data is read out from said plurality of memory areas while said plurality of memory areas is cyclically switched in said predetermined unit, during error correction by said error corrector.

6. A data reproducing apparatus comprising: reading means for reading out data from recording media; signal processing means for demodulating the data from said reading means; a plurality of memory areas to or from which the data demodulated via said signal processing means is written or read; and error correction means for correcting errors of said demodulated data, wherein said demodulated data is placed in said plurality of memory areas so that said demodulated data is read out from said plurality of memory areas while said plurality of memory areas is cyclically switched in a predetermined unit, during error correction by said error correction means;

wherein said demodulated data in said plurality of memory areas are more specifically stored in a two-dimensional row/column matrix type of arrangement having error correction data with respect to both rows and columns, and wherein the correcting errors operation is performed with respect to both rows and columns; and wherein said demodulated data in the rows are divided according to a first predetermined data unit, and said demodulated data in the columns are divided according to a second predetermined data unit, and wherein said plurality of memory areas are switched in a first predetermined burst length when said plurality of memory areas is accessed in a row direction, and wherein said plurality of memory areas are switched in a second predetermined burst length when said plurality of memory areas is accessed in a column direction.

7. A data reproducing apparatus as claimed in claim 6, wherein said demodulated data in said plurality of memory areas are stored in a multi-dimensional matrix type of arrangement having error correction data with respect to each dimension, and wherein the correcting errors operation is performed on data along all dimensions.

8. A data reproducing apparatus as claimed in claim 6, wherein said first predetermined data unit and said second predetermined data unit are equal, and wherein said first predetermined burst length and said second predetermined burst length are equal.

9. A data reproducing apparatus as claimed in claim 6, wherein said first predetermined data unit and said second predetermined data unit are different, and wherein said first predetermined burst length and said second predetermined burst length are different.

10. A data reproducing apparatus as claimed in claim 6, further comprising a memory control means for generating an address and a memory area selecting signal such that said demodulated data is read out from said plurality of memory areas while said plurality of memory areas is cyclically switched in said predetermined unit, during error correction by said error correction means.

11. A data reproducing apparatus comprising: a memory having a plurality of banks, a memory control circuit, data input means and error correction means for correcting errors of said data;

wherein said memory control circuit comprises address generation means for generating a first address and address conversion means for converting said first address into a second address for said memory and generating a bank switching signal;

wherein data written to said memory is separated every m (where m is a natural number) bytes and is provided with an identification address to form a sector, a matrix is formed by a collection of n (where n is a natural number) sectors, and a block is formed with a second error correction code being appended to the data in a column direction of said matrix and a first error correction code being appended to the data in a row direction of said matrix and the second error correction code; and wherein data inputted from said data input means is written to the memory while the banks are switched every predetermined number of rows or columns by said memory control circuit.

12. A data reproducing apparatus comprising: a memory having a plurality of banks, a memory control circuit, data input means and error correction means for correcting errors of said data;

wherein said memory control circuit comprises address generation means for generating a first address and address conversion means for converting said first address into a second address for said memory and generating a bank switching signal;

wherein data written to said memory is separated every m (where m is a natural number) bytes and is provided with an identification address to form a sector, a matrix is formed by a collection of n (where n is a natural number) sectors, and a block is formed with a second error correction code being appended to the data in a column direction of said matrix and a first error correction code being appended to the data in a row direction of said matrix and the second error correction code; and wherein the data inputted from said data input means is placed on said memory so that the data is read out from a plurality of banks while the banks are switched in a predetermined byte unit by said memory control circuit, during error correction in row and column directions by said error correction means.

13. A data reproducing apparatus according to claim 12, wherein the predetermined byte unit refers to the number of bytes that can be subjected to error correction at the same time.

14. A data reproducing apparatus comprising: a plurality of memories, a memory control circuit, data input means and error correction means for correcting errors of said data;

wherein said memory control circuit comprises address generation means for generating a first address and address conversion means for converting said first address into a second address for said memory and generating a memory switching signal;

wherein data written to said memory is separated every m (where m is a natural number) bytes and is provided with an identification address to form a sector, a matrix is formed by a collection of n (where n is a natural number) sectors, and a block is formed with a second error correction code being appended to the data in a column direction of said matrix and a first error correction code being appended to the data in a row direction of said matrix and the second error correction code; and wherein data inputted from said data input means is written to the memories while the memories are switched every predetermined number of rows or columns by said memory control circuit.

15. A data reproducing apparatus comprising: a plurality of memories, a memory control circuit, data input means and error correction means for correcting errors of said data;

wherein said memory control circuit comprises address generation means for generating a first address and address conversion means for converting said first address into a second address for said memory and generating a memory switching signal;

wherein data written to said memories is separated every m (where m is a natural number) bytes and is provided with an identification address to form a sector, a matrix is formed by a collection of n (where n is a natural number) sectors, and a block is formed with a second error correction code being appended to the data in a column direction and a first error correction code being appended to the data in a row direction and the second error correction code; and wherein the data inputted from said data input means is placed on said plurality of memories so that the data is read out from said plurality of memories while the memories are switched in a predetermined byte unit by said memory control circuit, during error correction in row and column directions by said error correction means.

16. A data reproducing apparatus according to claim 15, wherein the predetermined byte unit refers to the number of bytes that can be subjected to error correction at the same time.

17. A data reproducing apparatus, comprising: reading means for reading out data from recording media; signal processing means for demodulating the data from said reading means; a memory having a plurality of banks to or from which data demodulated via said signal processing means is written or read; and error correction means for correcting errors of said demodulated data, wherein data written to said memory is separated every m (where m is a natural number) bytes and is provided with an identification address to form a sector, a matrix is formed by a collection of n (where n is a natural number) sectors, and a block is formed with a second error correction code being appended to the data in a column direction of said matrix and a first error correction code being appended to the data in a row direction of said matrix and the second error correction code;

wherein an address signal for writing or reading said demodulated data is inputted to said memory from said signal processing means; and wherein the highest address of said address signal is switched every predetermined number of rows or columns of said matrix when said demodulated data is written onto the memory.

* * * * *